United States Patent
Kim et al.

(10) Patent No.: US 10,461,393 B2
(45) Date of Patent: Oct. 29, 2019

(54) BIDIRECTIONAL COUPLER, MONITOR CIRCUIT, AND FRONT-END CIRCUIT

(71) Applicant: Murata Manufacturing Co., Ltd., Kyoto (JP)

(72) Inventors: Ryangsu Kim, Kyoto (JP); Yasushi Shigeno, Kyoto (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

(21) Appl. No.: 15/989,740

(22) Filed: May 25, 2018

(65) Prior Publication Data

US 2018/0351229 A1 Dec. 6, 2018

(30) Foreign Application Priority Data

Jun. 1, 2017 (JP) ................. 2017-109527

(51) Int. Cl.
| | | |
|---|---|---|
| *H01P 5/18* | (2006.01) | |
| *H04B 17/10* | (2015.01) | |
| *H03H 1/00* | (2006.01) | |
| *H04W 52/24* | (2009.01) | |
| *H01P 5/19* | (2006.01) | |

(52) U.S. Cl.
CPC ............. *H01P 5/184* (2013.01); *H01P 5/185* (2013.01); *H03H 1/00* (2013.01); *H04B 17/101* (2015.01); *H04B 17/102* (2015.01); *H04W 52/247* (2013.01); *H03H 2001/005* (2013.01); *H04B 17/103* (2015.01)

(58) Field of Classification Search
CPC ............... H01P 5/18; H01P 5/184; H01P 5/19
USPC ........................................... 333/109, 116, 117
See application file for complete search history.

(56) References Cited

U.S. PATENT DOCUMENTS

| | | | | |
|---|---|---|---|---|
| 6,515,556 B1* | 2/2003 | Kato | ........................ | H01P 5/10 333/116 |
| 8,629,736 B2* | 1/2014 | Tamaru | ..................... | H01P 5/18 333/109 |
| 9,035,718 B2* | 5/2015 | Tamaru | ..................... | H01P 5/18 333/109 |
| 9,077,061 B2* | 7/2015 | Tamaru | ..................... | H01P 5/184 |
| 9,570,793 B2* | 2/2017 | Borodulin | ............... | H01P 5/185 |
| 9,647,314 B1* | 5/2017 | Nguyen | ..................... | H01P 5/18 |
| 9,673,504 B2* | 6/2017 | Meharry | ................. | H01P 5/187 |
| 9,748,627 B2* | 8/2017 | Sun | ........................... | H01P 5/18 |
| 9,838,055 B2* | 12/2017 | Mitake | .................... | H01P 5/184 |

FOREIGN PATENT DOCUMENTS

JP 2002-100909 A 4/2002

* cited by examiner

*Primary Examiner* — Dean O Takaoka
(74) *Attorney, Agent, or Firm* — Pearne & Gordon LLP

(57) ABSTRACT

A bidirectional coupler includes: a multilayer substrate; and a first main line, a second main line, and a sub line which are provided in or on the multilayer substrate. The sub line includes a first line portion being a portion electromagnetically coupled with the first main line and an even number of second line portions being portions electromagnetically coupled with the second main line. One half of the second line portions is provided between the first line portion and one end portion of the sub line, and the other half of the second line portions is provided between the first line portion and the other end portion of the sub line.

20 Claims, 9 Drawing Sheets

BIDIRECTIONAL COUPLER, MONITOR CIRCUIT, AND FRONT-END CIRCUIT

This application claims priority from Japanese Patent Application No. 2017-109527 filed on Jun. 1, 2017. The content of this application is incorporated herein by reference in its entirety.

BACKGROUND OF THE DISCLOSURE

1. Field of the Disclosure

The present disclosure relates to a bidirectional coupler, a monitor circuit, and a front-end circuit.

2. Description of the Related Art

A directional coupler configured to process a plurality of high-frequency signals each having a different frequency band has been known (see, for example, Japanese Unexamined Patent Application Publication No. 2002-100909).

FIG. 16 is a perspective view illustrating an example of a configuration of the directional coupler disclosed in Japanese Unexamined Patent Application Publication No. 2002-100909. Note that, constituent element names and reference signs used below may be different from those used in Japanese Unexamined Patent Application Publication No. 2002-100909, for convenience of explanation.

A directional coupler 9 in FIG. 16 includes a first main line 91, a second main line 92, a first sub line 93, a second sub line 94, and a ground 96.

The first main line 91 and the second main line 92 are arranged with the ground 96 interposed therebetween. The first sub line 93 and the second sub line 94 are arranged with the ground 96 interposed therebetween, and are coupled with the first main line 91 and the second main line 92, respectively. One end portion of the first sub line 93 and one end portion of the second sub line 94 are connected to each other, whereby a single sub line 95 is configured.

One end portion and the other end portion of the first main line 91 configure an input port P1 and an output port P2, respectively, and one end portion and the other end portion of the second main line 92 configure an input port P3 and an output port P4, respectively. One end portion and the other end portion of the sub line 95 configure a coupling port P5 and an isolation port P6, respectively.

The directional coupler 9 is, for example, provided in a dual-band-support cellular phone terminal configured to process two transmission signals each having a different frequency band, and is used for monitoring the intensities of the transmission signals.

Specifically, one and the other of the two transmission signals are supplied to the input ports P1 and P3, propagate through the first main line 91 and the second main line 92, and are supplied to antennas from the output ports P2 and P4, respectively. A first monitor signal in accordance with the intensities of the transmission signals is extracted from the coupling port P5. The first monitor signal is used, for example, for feedback control of a transmission power.

BRIEF SUMMARY OF THE DISCLOSURE

These days, a bidirectional coupler configured to monitor both a forward signal and a backward signal is demanded for a directional coupler. Here, the forward signal refers to a signal propagating through a main line from an input port toward an output port, and the backward signal refers to a signal propagating through the main line from the output port toward the input port.

A basic configuration of the bidirectional coupler is the same as a four-port directional coupler. Accordingly, although not mentioned in Japanese Unexamined Patent Application Publication No. 2002-100909, also in the directional coupler 9, it is possible to extract from the isolation port P6 a second monitor signal in accordance with the intensities of backward signals (for example, a reflected wave from an antenna) propagating through the first main line 91 and the second main line 92.

However, when the directional coupler 9 is used as a bidirectional coupler, directivity with respect to the forward signal and directivity with respect to the backward signal are different in the directional coupler 9. Thus, when the directional coupler 9 is used as the bidirectional coupler, the directivity with respect to the forward signal and the directivity with respect to the backward signal are not even, and a problem arises in which the directivity of the forward signal and the directivity of the backward signal are not equivalent.

Accordingly, it is desired to provide a bidirectional coupler in which it is possible to monitor a forward signal and a backward signal in each of two signal lines, and directivity with respect to the forward signal and directivity with respect to the backward signal are both good.

A bidirectional coupler according to a preferred embodiment of the present disclosure includes a multilayer substrate, and a first main line, a second main line, and a sub line, wherein the first main line, the second main line, and the sub line are provided in or on the multilayer substrate, in which the sub line includes a first line portion being a portion electromagnetically coupled with the first main line and an even number of second line portions being portions electromagnetically coupled with the second main line, one half of the even number of second line portions are provided between the first line portion and one end portion of the sub line, and another half of the even number of second line portions are provided between the first line portion and another end portion of the sub line.

According to this configuration, on both sides of the first line portion of the sub line, the first line portion being a coupling portion with the first main line, the same numbers of the second line portions of the sub line, the second line portions being coupling portions with the second main line are provided. Accordingly, it is possible to arrange the coupling portions with the second main line symmetrically with the coupling portion with the first main line being a center, in the sub line. By arranging the coupling portions as described above, it is possible to substantially equalize electrical characteristics from the first main line to one end portion and another end portion of the sub line, with electrical characteristics from the second main line to the one end portion and another end portion of the sub line.

Thus, it is possible to improve both the directivity of a first monitor signal corresponding to a forward signal and the directivity of a second monitor signal corresponding to a backward signal. As a result, the bidirectional coupler is obtained in which directivity with respect to the forward signal and directivity with respect to the backward signal are both improved.

The first line portion may include a pair of first line portions.

According to this configuration, since it is possible to divide and arrange the first line portion, the flexibility of sub line layout increases.

Further, an electrical length between a midpoint in terms of electrical length of the sub line and one of the pair of first line portions may substantially be equal to an electrical length between the midpoint and another of the pair of first line portions.

According to this configuration, since the coupling portions of the sub line with the first main line are arranged symmetrically in terms of electrical length on the sub line, electrical characteristics from the first main line to one end portion and another end portion of the sub line may be substantially equalized more precisely. As a result, a bidirectional coupler is obtained in which both directivity with respect to the forward signal and directivity with respect to the backward signal are improved.

Further, the even number of second line portions may be a pair of second line portions, and an electrical length between the midpoint in terms of electrical length of the sub line and one of the pair of second line portions may substantially be equal to an electrical length between the midpoint and another of the pair of second line portions.

According to this configuration, since the coupling portions of the sub line with the second main line are arranged symmetrically in terms of electrical length on the sub line, electrical characteristics from the second main line to one end portion and another end portion of the sub line may be substantially equalized more precisely. As a result, the bidirectional coupler is obtained in which both directivity with respect to the forward signal and directivity with respect to the backward signal are improved.

The even number of second line portions may be a pair of second line portions, and in a first area and a second area on both sides of a straight line therebetween on the multilayer substrate, the sub line may be provided to be symmetrical with the straight line being a symmetry axis, and one and another one of the pair of second line portions may be arranged at corresponding positions of the sub line provided to be symmetrical.

According to this configuration, electrical characteristics from the second main line to one end portion and another end portion of the sub line may be substantially equalized more precisely, based on symmetry of the shape of the sub line. As a result, the bidirectional coupler is obtained in which directivity with respect to the forward signal and directivity with respect to the backward signal are both improved.

In a first area and a second area on both sides of a straight line on the multilayer substrate, the sub line may be provided to be symmetrical with the straight line being a symmetry axis, and one and another one of the pair of first line portions may be arranged at corresponding positions of the sub line provided to be symmetrical.

According to this configuration, electrical characteristics from the first main line to one end portion and another end portion of the sub line may be substantially equalized more precisely, based on symmetry of the shape of the sub line. As a result, the bidirectional coupler is obtained in which directivity with respect to the forward signal and directivity with respect to the backward signal are both improved.

Further, one and another one of the pair of first line portions may be interconnected with an inductor.

According to this configuration, since it is possible to insert the inductor in series into the midpoint of the sub line, directivity of the bidirectional coupler may be further improved.

Further, a width in the first line portion and a width in each of the even number of second line portions, of the sub line, may be different from each other.

According to this configuration, coupling between the sub line and each of the first main line and the second main line may be optimized in accordance with the widths of the sub line.

A monitor circuit according to a preferred embodiment of the present disclosure includes the bidirectional coupler.

According to this configuration, by using the bidirectional coupler in which both the directivity with respect to the forward signal and the directivity with respect to the backward signal are improved, the monitor circuit configured to monitor both the forward signal and the backward signal with high precision can be obtained.

A front-end circuit according to a preferred embodiment of the present disclosure includes, the monitor circuit, an antenna terminal connected to the monitor circuit, and a filter connected to the monitor circuit.

According to this configuration, by using the monitor circuit including the bidirectional coupler in which both the directivity with respect to the forward signal and the directivity with respect to the backward signal are improved, for example, it is possible to configure a high-performance communication device configured to perform various types of control including feedback control of a transmission power and matching adjustment of an antenna with high precision.

Other features, elements, characteristics and advantages of the present disclosure will become more apparent from the following detailed description of preferred embodiments of the present disclosure with reference to the attached drawings.

BRIEF DESCRIPTION OF THE SEVERAL
VIEWS OF THE DRAWINGS

DETAILED DESCRIPTION OF THE DISCLOSURE

Knowledge Underlying the Present Disclosure

Figure 16:
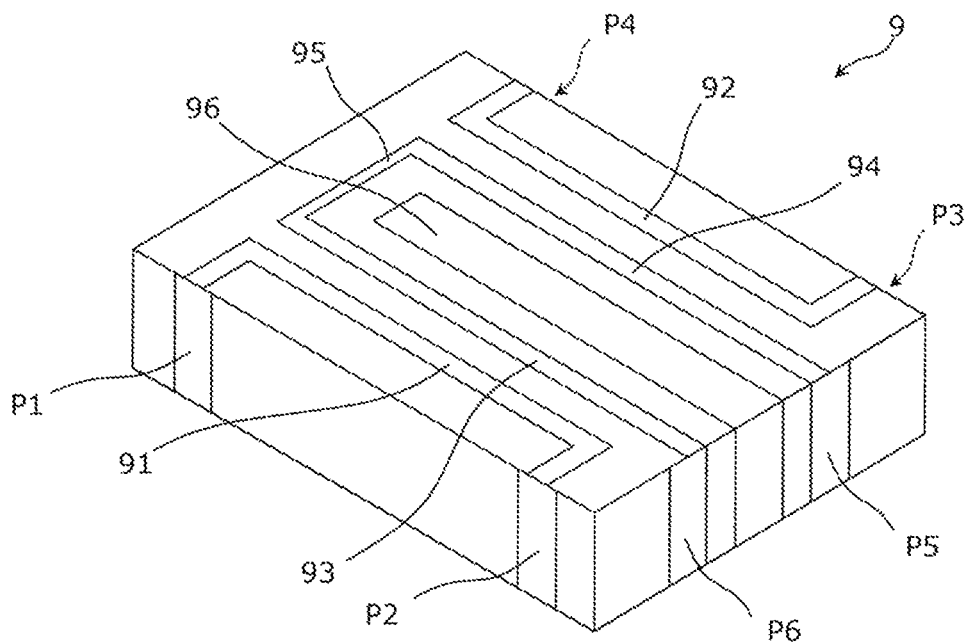
FIG. 16 is a perspective view illustrating an example of a configuration of a directional coupler according to the related art.

A factor that makes the directivity with respect to the forward signal and the directivity with respect to the backward signal of the directional coupler 9 in FIG. 16 different will be considered.

Figure 17:
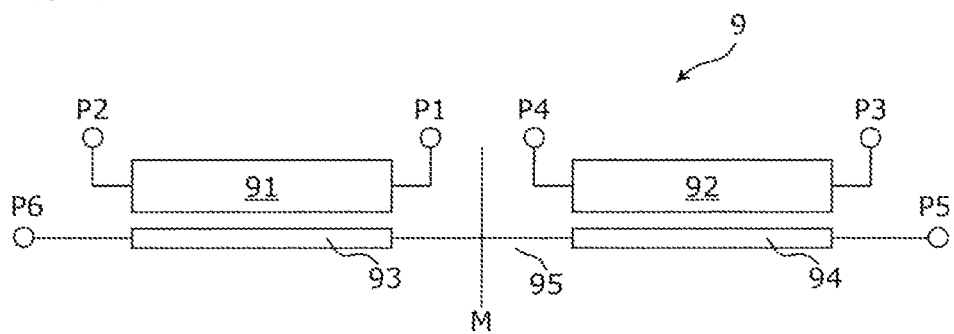
FIG. 17 is a circuit diagram illustrating an example of an equivalent circuit of the directional coupler according to the related art.

FIG. 17 is a circuit diagram illustrating an example of an equivalent circuit of the directional coupler 9. In FIG. 17, a sub line 95 is illustrated as a straight line, and a midpoint M in an electrical length of the sub line 95 is shown, for understanding.

As illustrated in FIG. 17, in the directional coupler 9, the first main line 91 and the first sub line 93 are coupled only between the midpoint M of the sub line 95 and the isolation port P6. In addition, the second main line 92 and the second sub line 94 are coupled only between the midpoint M of the sub line 95 and the coupling port P5. That is, a coupling portion of the sub line 95 with the first main line 91 and a coupling portion of the sub line 95 with the second main line 92 are arranged asymmetrically in the sub line 95.

Accordingly, electrical characteristics from the first main line 91 to the coupling port P5 of the sub line 95 and electrical characteristics from the first main line 91 to the isolation port P6 of the sub line 95 are different. Thus, a first monitor signal corresponding to a forward signal and a second monitor signal corresponding to a backward signal propagating through the first main line 91 are extracted respectively from the coupling port P5 and the isolation port P6 each having different electrical characteristics from the first main line 91. As a result, a difference in characteristics arises with respect to the forward signal and the backward signal propagating through the first main line 91 of the directional coupler 9.

Since the same holds true for the second main line 92, a difference in characteristics also arises with respect to a forward signal and a backward signal propagating through the second main line 92 in the directional coupler 9.

As described above, asymmetric arrangement of the coupling portions may be regarded as a main factor making the directivity with respect to the forward signal and the directivity with respect to the backward signal different in the directional coupler 9.

The inventors of the present disclosure diligently reviewed based on this consideration, and finally invented a bidirectional coupler, having two main lines, in which characteristics with respect to a forward signal and characteristics with respect to a backward signal are identical for both the main lines.

The above-described bidirectional coupler includes a multilayer substrate, and a first main line, a second main line, and a sub line wherein the first main line, and second main line, and the sub line are provided in or on the multilayer substrate. The sub line includes a first line portion being a portion electromagnetically coupled with the first main line and an even number of second line portions being portions electromagnetically coupled with the second main line. One half of the even number of second line portions are provided between the first line portion and one end portion of the sub line, and another half of the even number of second line portions is provided between the first line portion and another end portion of the sub line.

Hereinafter, embodiments of the present disclosure will be described in detail with reference to the drawings. Note that each of the embodiments described hereinafter represents a comprehensive or specific example. Numerical values, shapes, materials, constituent elements, arrangements of constituent elements, forms of connection, and so on described in the following embodiments are merely examples, and are not intended to limit the present disclosure. Of the constituent elements described in the following embodiments, constituent elements not mentioned in the independent claims are described as optional constituent elements. Furthermore, the sizes or ratios between sizes of the constituent elements illustrated in the drawings are not necessarily representing those in actual products.

Embodiment 1

Figure 1:
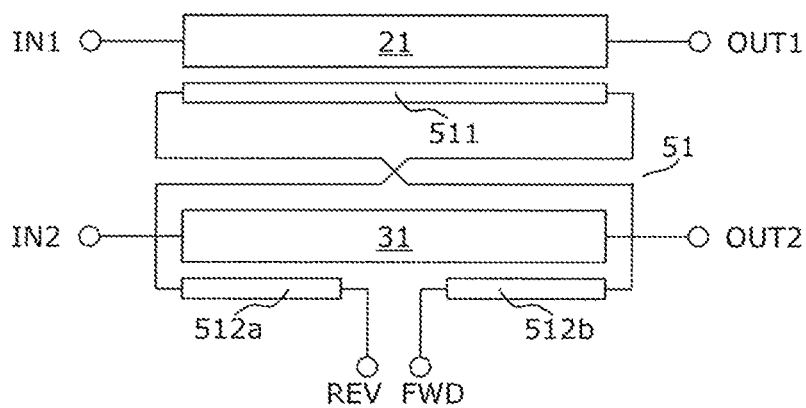
FIG. 1 is a circuit diagram illustrating an example of an equivalent circuit of a bidirectional coupler according to Embodiment 1.

FIG. 1 is a circuit diagram illustrating an example of an equivalent circuit of a bidirectional coupler according to Embodiment 1.

As illustrated in FIG. 1, a bidirectional coupler 1 includes a first main line 21, a second main line 31, and a sub line 51.

One end portion and another end portion of the first main line 21 configure an input port IN1 and an output port OUT1, respectively, and one end portion and another end portion of the second main line 31 configure an input port IN2 and an output port OUT2, respectively. One end portion and another end portion of the sub line 51 configure a forward port FWD and a reverse port REV, respectively.

The sub line 51 includes a first line portion 511 being a portion coupled with the first main line 21, and a pair of second line portions 512a and 512b being portions coupled with the second main line 31. Here, the pair of second line portions 512a and 512b is an example of an even number of second line portions.

The second line portion 512a is provided between the first line portion 511 of the sub line 51 and the reverse port REV, and the second line portion 512b is provided between the first line portion 511 of the sub line 51 and the forward port FWD. The first line portion 511 is extended in substantially the same direction as the first main line 21, and the pair of second line portions 512a and 512b are extended in substantially the same direction as the second main line 31.

Figure 2:
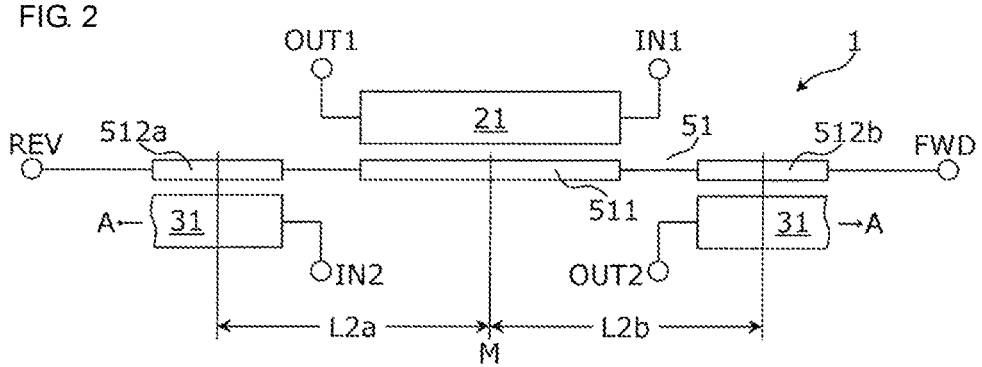
FIG. 2 is a circuit diagram illustrating the example of the equivalent circuit of the bidirectional coupler according to Embodiment 1.

FIG. 2 is a circuit diagram illustrating the same circuit as the equivalent circuit in FIG. 1. In FIG. 2, the sub line 51 is illustrated as a straight line, and a midpoint M in terms of electrical length of the sub line 51 is illustrated, for understanding. Although the second main line 31 is divided into a half section on an input port IN2 side and a half section on an output port OUT2 side in the illustration, the two sections are continuous at a point A in reality.

As understood from FIG. 2, the second line portions 512a and 512b being coupling portions of the sub line 51 with the second main line 31 are provided on both sides of the first line portion 511 being a coupling portion of the sub line 51 with the first main line 21, respectively, in the bidirectional coupler 1.

Accordingly, it is possible to arrange in the sub line 51 the coupling portions (the second line portions 512a and 512b) with the second main line 31 symmetrically with the coupling portion (the first line portion 511) with the first main line 21 being a center.

By arranging the coupling portions as described above, it is possible to substantially equalize electrical characteristics from the first main line 21 to the forward port FWD with electrical characteristics from the first main line 21 to the reverse port REV, and substantially equalize electrical characteristics from the second main line 31 to the forward port FWD with electrical characteristics from the second main line 31 to the reverse port REV.

Accordingly, it is possible to improve both directivity of a first monitor signal corresponding to a forward signal and directivity of a second monitor signal corresponding to a backward signal. As a result, the bidirectional coupler 1 is obtained in which directivity with respect to the forward signal and directivity with respect to the backward signal are both improved for both the first main line 21 and the second main line 31.

Note that, as illustrated in FIG. 2, an electrical length L2a between the midpoint M and the second line portion 512a and an electrical length L2b between the midpoint M and the second line portion 512b, in the sub line 51, may substantially be equal.

Accordingly, in the sub line 51, since the second line portions 512a and 512b are arranged on symmetric positions in terms of electrical length on the sub line 51, electrical characteristics from the second main line 31 to the forward port FWD and electrical characteristics from the second main line 31 to the reverse port REV may be substantially equalized more precisely. As a result, the bidirectional coupler 1 is obtained in which directivity with respect to the forward signal and directivity with respect to the backward signal are both improved.

A description about the structural characteristics of the bidirectional coupler 1 follows.

Figure 3:
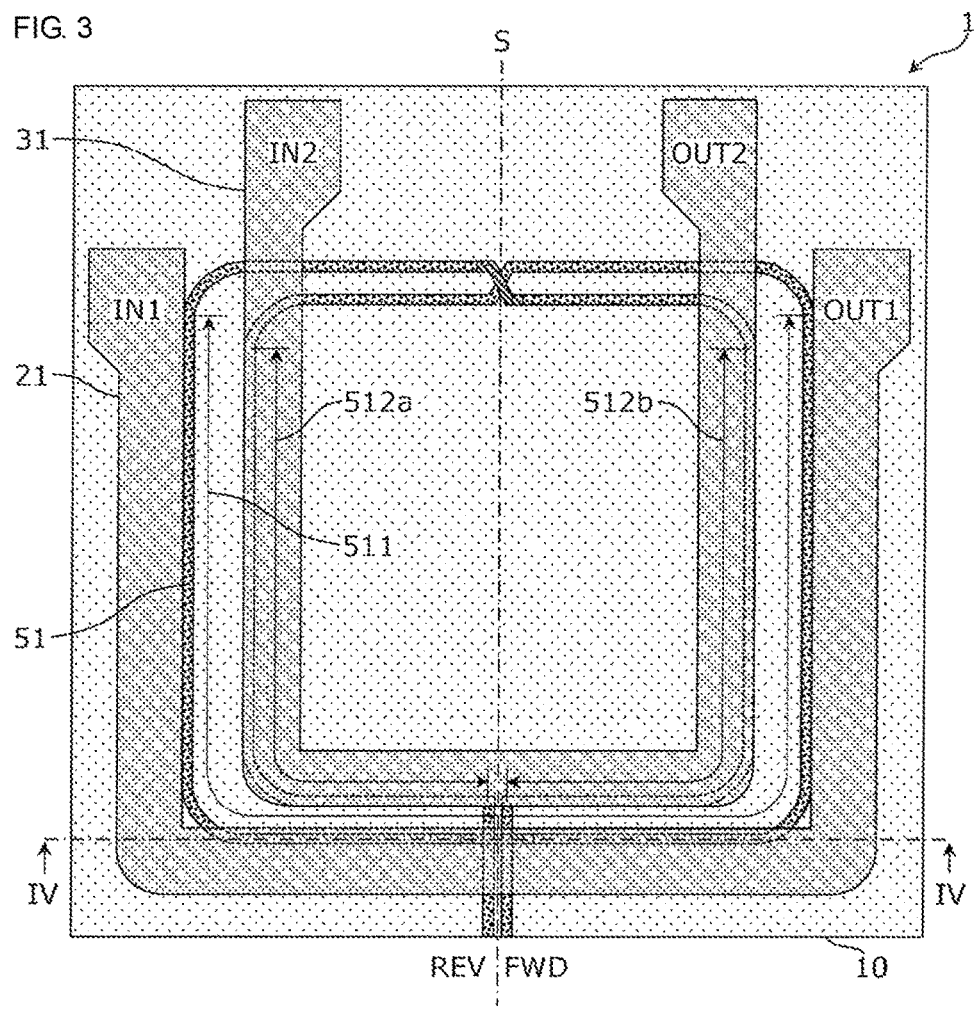
FIG. 3 is a plan view illustrating an example of a configuration of the bidirectional coupler according to Embodiment 1.

FIG. 3 is a plan view illustrating an example of a configuration of the bidirectional coupler 1.

Figure 4:
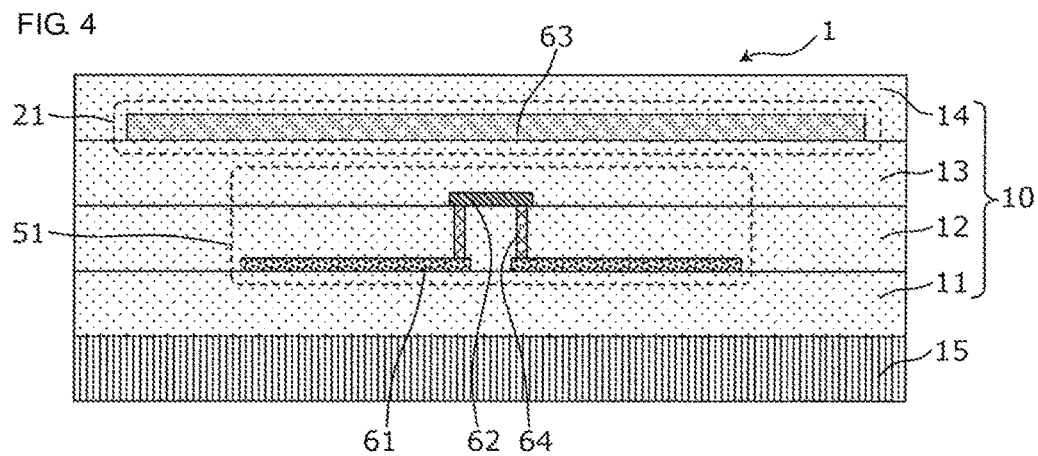
FIG. 4 is a sectional view illustrating the example of the configuration of the bidirectional coupler according to Embodiment 1.

FIG. 4 is a sectional view illustrating the example of the configuration of the bidirectional coupler 1, and corresponds to a section taken along a line IV-IV in FIG. 3 and viewed along an arrow direction.

In FIGS. 3 and 4, a different pattern is applied to illustrate each constituent element for clarity.

As illustrated in FIG. 4, the bidirectional coupler 1 includes a first layer metal wiring 61, a second layer metal wiring 62, and a third layer metal wiring 63, that are formed above a substrate 15 and are isolated from one another by insulating interlayers 11, 12, 13, and 14, and a via conductor 64 interconnecting the first layer metal wiring 61 and the second layer metal wiring 62. For example, a multilayer body including the substrate 15 and the insulating interlayers 11 to 14 corresponds to a multilayer substrate 10.

The first layer metal wiring 61 is disposed on an interface between the insulating interlayer 11 and the insulating interlayer 12, and the second layer metal wiring 62 is disposed on an interface between the insulating interlayer 12 and the insulating interlayer 13, and the third layer metal wiring 63 is disposed on an interface between the insulating interlayer 13 and the insulating interlayer 14. The via conductor 64 is provided by penetrating the insulating interlayer 12.

The sub line 51 is formed of the first layer metal wiring 61, the second layer metal wiring 62, and the via conductor 64. The first main line 21 and the second main line 31 (not illustrated in FIG. 4) are formed of the third layer metal wiring 63.

For example, the substrate 15 may be a semiconductor substrate. In this case, the bidirectional coupler 1 is produced by forming a plurality of wiring layers on the semiconductor substrate with insulating interlayers interposed therebetween, using a well-known semiconductor process.

As another example, each of the substrate 15 and the insulating interlayers 11, 12, 13, and 14 may be a base material layer made of a low-temperature co-fired ceramics (LTCC) material. In this case, the bidirectional coupler 1 is produced by laminating, integrating, and firing a plurality of ceramic green sheets on each of which conductive paste to be a metal wiring is disposed.

As further another example, each of the substrate 15 and the insulating interlayers 11, 12, 13, and 14 may be an insulating resin layer forming a corresponding layer of a multilayer printed circuit board. In this case, the bidirectional coupler 1 is produced as a multilayer printed circuit board by laminating a plurality of insulating resin layers on each of which a wiring pattern as a metal wiring is disposed, and providing a through-hole as a via conductor.

Figure 5:
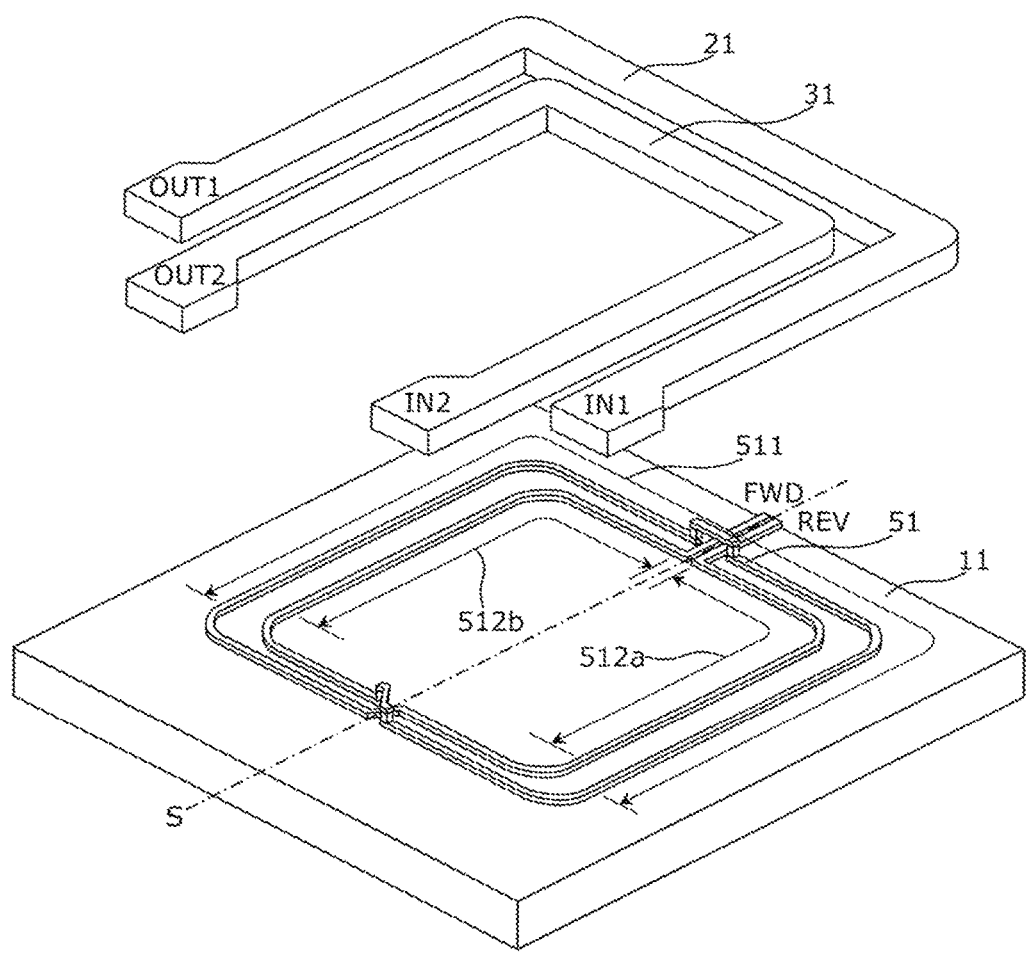
FIG. 5 is an exploded perspective view illustrating an example of a three-dimensional structure of the bidirectional coupler according to Embodiment 1.

FIG. 5 is an exploded perspective view illustrating an example of a three-dimensional structure of the bidirectional coupler 1. In FIG. 5, the insulating interlayers 12, 13, and 14 are omitted, and the first main line 21 and the second main line 31 are drawn above actual positions thereof, in order to illustrate a shape of the sub line 51 in an easy-to-understand manner.

As illustrated in FIG. 5, the first main line 21 and the second main line 31 are formed to have a substantially U-shaped nesting structure, with the first main line 21 being arranged at an outer side portion, and the second main line 31 being arranged at an inner side portion, and the sub line 51 is formed to have a double-looped structure including two three-dimensional crossing portions. The sub line 51 runs first from the forward port FWD through half an internal loop, goes out to an external loop, runs through the whole external loop, goes into the internal loop, runs through half the internal loop, and reaches the reverse port REV.

As illustrated in FIG. 5, the second line portion 512b is extended in substantially the same direction as the second main line 31 within a half loop section on the forward port FWD side of the internal loop of the sub line 51, and is coupled with a half section on the output port OUT2 side of the second main line 31. The first line portion 511 is extended in substantially the same direction as the first main line 21 on the external loop of the sub line 51, and is coupled with the first main line 21. The second line portion 512a is extended in substantially the same direction as the second main line 31 in a half loop section on the reverse port REV side of the internal loop of the sub line 51, and is coupled with a half section on the input port IN2 side of the second main line 31.

As illustrated in FIG. 3 and FIG. 5, in a first area and a second area on both sides of a straight line S on the multilayer substrate 10, the sub line 51 is provided to be symmetrical with the straight line S being a symmetry axis, and the second line portions 512a and 512b are arranged at corresponding positions of the sub line to be symmetrical.

Accordingly, based on symmetry of the shape of the sub line 51, electrical characteristics from the second main line 31 to the forward port FWD and electrical characteristics from the second main line 31 to the reverse port REV may be substantially equalized more precisely. As a result, the bidirectional coupler 1 is obtained in which directivity with respect to the forward signal and directivity with respect to the backward signal are both improved.

Embodiment 2

In Embodiment 2, a variation on a first main line, a second main line, and a sub line will be described.

Figure 6:
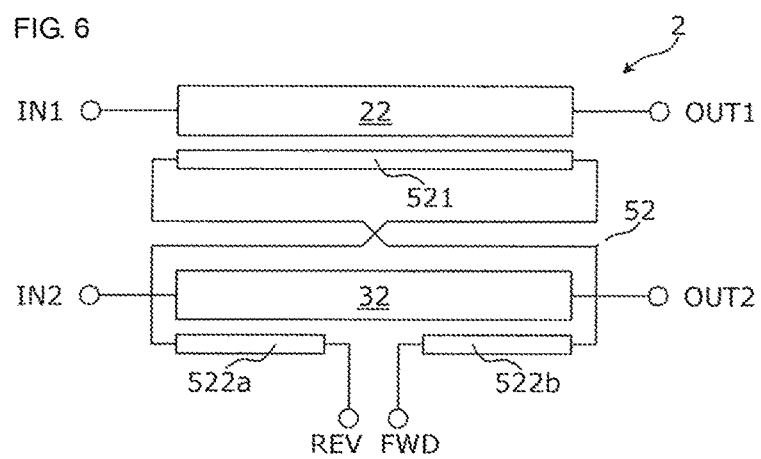
FIG. 6 is a circuit diagram illustrating an example of an equivalent circuit of a bidirectional coupler according to Embodiment 2.

FIG. 6 is a circuit diagram illustrating an example of an equivalent circuit of a bidirectional coupler according to Embodiment 2.

As illustrated in FIG. 6, a bidirectional coupler 2 includes a first main line 22, a second main line 32, and a sub line 52.

The sub line 52 includes a first line portion 521 being a portion coupled with the first main line 22, and a pair of second line portions 522a and 522b being portions coupled with the second main line 32. Here, the pair of second line portions 522a and 522b is an example of an even number of second line portions.

The second line portion 522a is provided between the first line portion 521 of the sub line 52 and a reverse port REV, and the second line portion 522b is provided between the first line portion 521 of the sub line 52 and a forward port FWD. The first line portion 521 is extended in substantially the same direction as the first main line 22, and the pair of second line portions 522a and 522b are extended in substantially the same direction as the second main line 32.

Also in the bidirectional coupler 2, as in the bidirectional coupler 1, the second line portions 522a and 522b being coupling portions of the sub line 52 with the second main line 32 are provided on both sides of the first line portion 521 being a coupling portion of the sub line 52 with the first main line 22, respectively.

Accordingly, it is possible to arrange in the sub line 52 the coupling portions (the second line portions 522a and 522b) with the second main line 32 symmetrically with the coupling portion (the first line portion 521) with the first main line 22 being a center.

By arranging the coupling portions as described above, it is possible to substantially equalize electrical characteristics from the first main line 22 to the forward port FWD with electrical characteristics from the first main line 22 to the reverse port REV, and substantially equalize electrical characteristics from the second main line 32 to the forward port FWD with electrical characteristics from the second main line 32 to the reverse port REV.

Accordingly, it is possible to improve both directivity of a first monitor signal corresponding to a forward signal and directivity of a second monitor signal corresponding to a backward signal. As a result, the bidirectional coupler 2 is obtained in which directivity with respect to the forward signal and directivity with respect to the backward signal are both improved, for both the first main line 22 and the second main line 32.

A description about the structural characteristics of the bidirectional coupler 2 follows.

Figure 7:
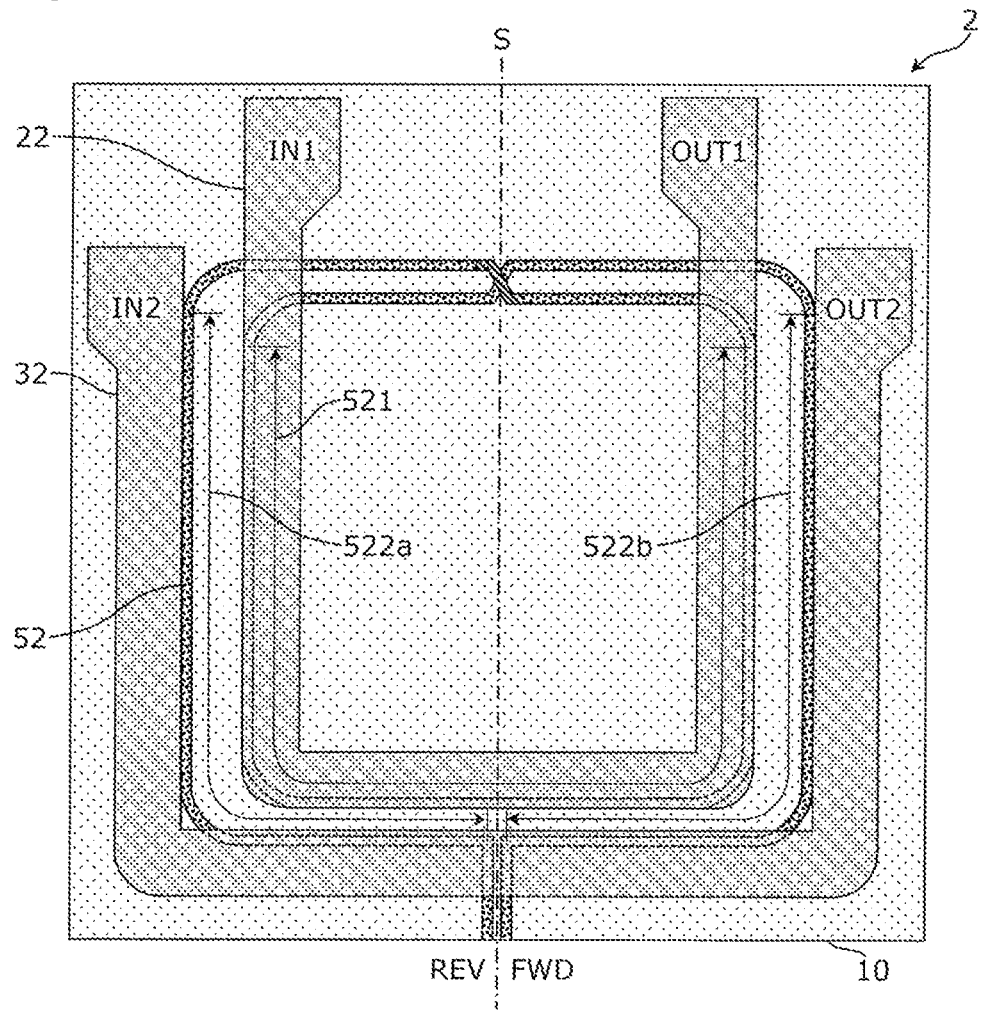
FIG. 7 is a plan view illustrating an example of a configuration of the bidirectional coupler according to Embodiment 2.

FIG. 7 is a plan view illustrating an example of a configuration of the bidirectional coupler 2. The bidirectional coupler 2 in FIG. 7 is different from the bidirectional coupler 1 of Embodiment 1, in arrangement of the first main line 22 and the second main line 32, and in a shape of the sub line 52. Hereinafter, constituent elements that are the same as in Embodiment 1 will be given the same reference numerals, and descriptions thereof will be appropriately omitted.

As illustrated in FIG. 7, the first main line 22 and the second main line 32 are formed to have a substantially U-shaped nesting structure, with the first main line 22 being arranged at an inner side portion, and the second main line 32 being arranged at an outer side portion, and the sub line 52 is formed to have a double-looped structure including one three-dimensional crossing. The sub line 52 runs first from the forward port FWD through half an external loop, goes into an internal loop, runs through the whole internal loop, goes out to the external loop, runs through half the external loop, and reaches the reverse port REV.

As illustrated in FIG. 7, the second line portion 522b is extended in substantially the same direction as the second main line 32 within a half loop section on the forward port FWD side of the external loop of the sub line 52, and is coupled with a half section on an output port OUT2 side of the second main line 32. The first line portion 521 is extended in substantially the same direction as the first main line 22 within the internal loop of the sub line 52, and is coupled with the first main line 22. The second line portion 522a is extended in substantially the same direction as the second main line 32 within a half loop section on the reverse port REV side of the external loop of the sub line 52, and is coupled with a half section on an input port IN2 side of the second main line 32.

As illustrated in FIG. 7, in a first area and a second area on both sides of a straight line S on the multilayer substrate 10, the sub line 52 is provided to be symmetrical with the straight line S being a symmetry axis, and the second line portions 522a and 522b are arranged at corresponding positions of the sub line provided to be symmetrical.

Accordingly, based on symmetry of the shape of the sub line 52, electrical characteristics from the second main line 32 to the forward port FWD and electrical characteristics from the second main line 32 to the reverse port REV may be substantially equalized more precisely. As a result, the bidirectional coupler 2 is obtained in which directivity with respect to the forward signal and directivity with respect to the backward signal are both improved.

Embodiment 3

In Embodiment 3, a variation on a first main line, a second main line, and a sub line will be described.

Figure 8:
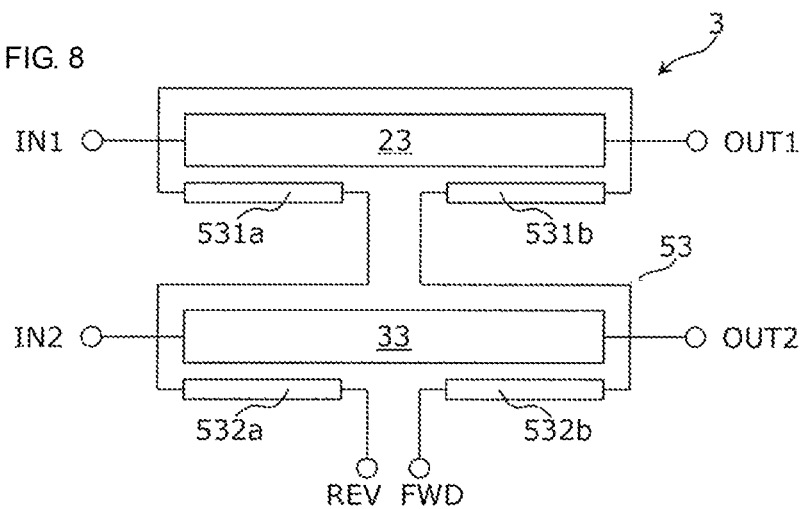
FIG. 8 is a circuit diagram illustrating an example of an equivalent circuit of a bidirectional coupler according to Embodiment 3.

FIG. 8 is a circuit diagram illustrating an example of an equivalent circuit of a bidirectional coupler according to Embodiment 3.

As illustrated in FIG. 8, a bidirectional coupler 3 includes a first main line 23, a second main line 33, and a sub line 53.

The sub line 53 includes a pair of first line portions 531a and 531b being portions coupled with the first main line 23, and a pair of second line portions 532a and 532b being portions coupled with the second main line 33. Here, the pair of second line portions 532a and 532b is an example of an even number of second line portions.

The second line portion 532a is provided between the first line portion 531a and a reverse port REV, and the second line portion 532b is provided between the first line portion 531b and a forward port FWD. The pair of first line portions 531a and 531b are extended in substantially the same direction as the first main line 23, and the pair of second line portions 532a and 532b are extended in substantially the same direction as the second main line 33.

Figure 9:
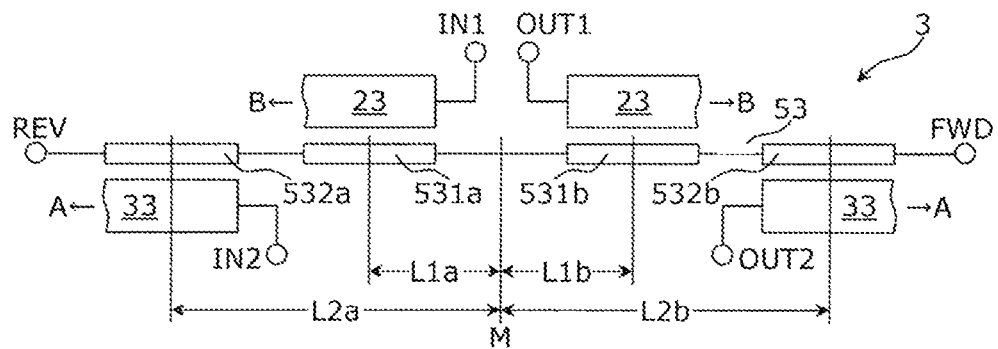
FIG. 9 is a circuit diagram illustrating the example of the equivalent circuit of the bidirectional coupler according to Embodiment 3.

FIG. 9 is a circuit diagram illustrating the same circuit as the equivalent circuit in FIG. 8. In FIG. 9, the sub line 53 is illustrated as a straight line, and a midpoint M in terms of electrical length of the sub line 53 is illustrated, for understanding. Although the second main line 33 is divided into a half section on an input port IN2 side and a half section on an output port OUT2 side in the illustration, the two sections are continuous at a point A in reality. Although the first main line 23 is divided into a half section on an input port IN1 side and a half section on an output port OUT1 side in the illustration, the two sections are continuous at a point B in reality.

As understood from FIG. 9, in the bidirectional coupler 3, a coupling portion of the sub line 53 with the first main line 23 is formed of the pair of first line portions 531a and 531b, respectively, and on both sides of the coupling portion, the second line portions 532a and 532b being coupling portions of the sub line 53 with the second main line 33 are provided, respectively.

Accordingly, it is possible to arrange in the sub line 53 the coupling portions (the second line portions 532a and 532b) with the second main line 33 symmetrically with the coupling portion (the pair of first line portions 531a and 531b) with the first main line 23 being a center.

By arranging the coupling portions as described above, it is possible to substantially equalize electrical characteristics from the first main line 23 to the forward port FWD with electrical characteristics from the first main line 23 to the reverse port REV, and substantially equalize electrical characteristics from the second main line 33 to the forward port FWD with electrical characteristics from the second main line 33 to the reverse port REV.

Since a first line portion is divided into and arranged as the pair of first line portions 531a and 531b, the flexibility of a shape of the sub line 53 increases.

Accordingly, it is possible to improve both directivity of a first monitor signal corresponding to the forward signal and directivity of a second monitor signal corresponding to the backward signal. As a result, the bidirectional coupler 3 is obtained in which directivity with respect to the forward signal and directivity with respect to the backward signal are both improved, for both the first main line 23 and the second main line 33.

Note that, as illustrated in FIG. 9, an electrical length L1a between the midpoint M and the first line portion 531a and an electrical length L1b between the midpoint M and the first line portion 531b, in the sub line 53, may substantially be equal. Further, the electrical length L2a between the midpoint M and the second line portion 532a and the electrical length L2b between the midpoint M and the second line portion 532b may substantially be equal.

Accordingly, in the sub line 53, the first line portions 531a and 531b are arranged at symmetric positions in terms of electrical length on the sub line 53, and the second line portions 532a and 532b are arranged at symmetric positions in terms of electrical length on the sub line 53. Accordingly, electrical characteristics from the first main line 23 and the second main line 33 to the forward port FWD and the reverse port REV may be substantially equalized more precisely. As a result, the bidirectional coupler 3 is obtained in which directivity with respect to the forward signal and directivity with respect to the backward signal are both improved.

A description about the structural characteristics of the bidirectional coupler 3 follows.

Figure 10:
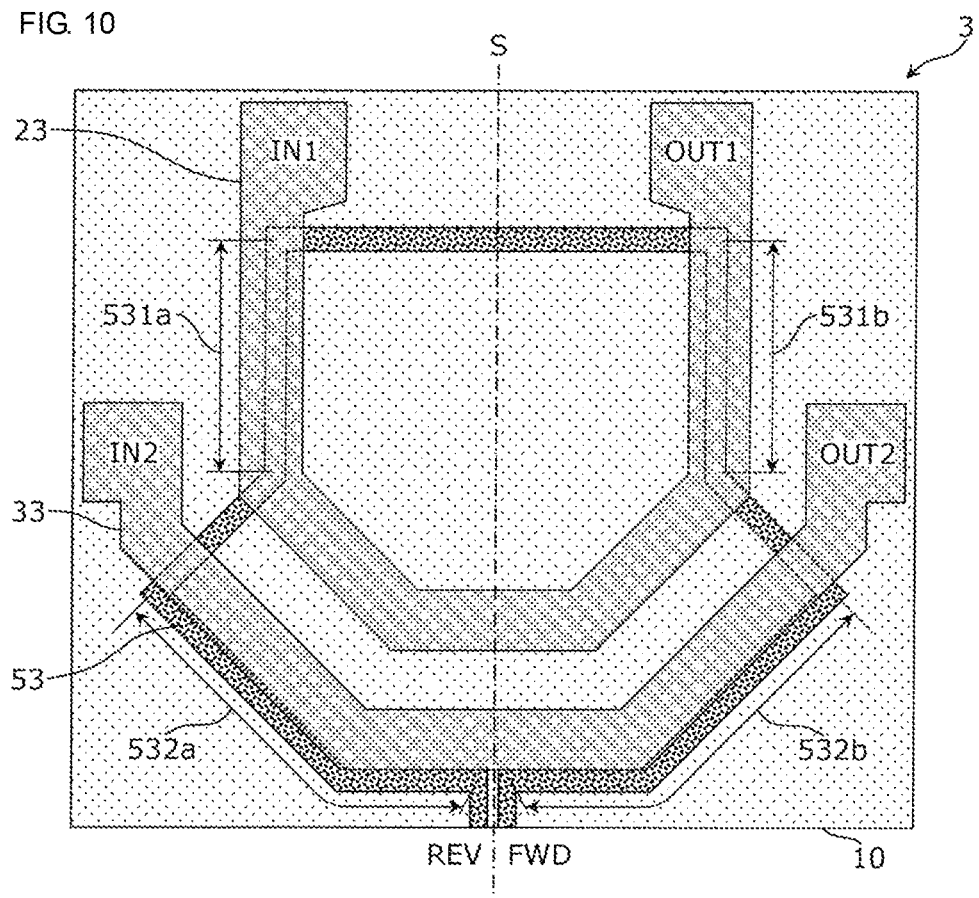
FIG. 10 is a plan view illustrating an example of a configuration of the bidirectional coupler according to Embodiment 3.

FIG. 10 is a plan view illustrating an example of a configuration of the bidirectional coupler 3. The bidirectional coupler 3 in FIG. 10 is different from the bidirectional coupler 1 in FIG. 3, in respective shapes of the first main line 23, the second main line 33, and the sub line 53. Hereinafter, constituent elements that are the same as in Embodiment 1 will be given the same reference numerals, and descriptions thereof will be appropriately omitted.

As illustrated in FIG. 10, the first main line 23 and the second main line 33 are formed as substantially nested V-shapes each having a different opening angle, with the first main line 23 being arranged at an inner side portion, and the second main line 33 being arranged at an outer side portion. The sub line 53 is formed to have one-looped shape including no three-dimensional crossings. The sub line 53 runs, from the forward port FWD, rounds along the first main line 23 and the second main line 33 and reaches the reverse port REV.

As illustrated in FIG. 10, the second line portion 532b is extended in substantially the same direction as the second main line 33 within a quarter loop section from the forward port FWD of the sub line 53, and is coupled with a half section on the output port OUT2 side of the second main line 33. The first line portion 531b is extended in substantially the same direction as the first main line 23 within a next quarter loop section of the sub line 53, and is coupled with a half section on the output port OUT1 side of the first main line 23.

The first line portion 531a is extended in substantially the same direction as the first main line 23 within a next quarter loop section of the sub line 53, and is coupled with a half section on the input port IN1 side of the first main line 23. The second line portion 532a is extended in substantially the same direction as the second main line 33 within a remaining quarter loop section of the sub line 53, and is coupled with a half section on the input port IN2 side of the second main line 33.

As illustrated in FIG. 10, in a first area and a second area on both side of a straight line S on the multilayer substrate 10, the sub line 53 is provided to be symmetrical with the straight line S being a symmetry axis, and the first line portions 531a and 531b, and the second line portions 532a and 532b are arranged at corresponding positions, respectively, of the sub line provided to be symmetrical.

Accordingly, based on symmetry of the shape of the sub line 53, electrical characteristics from the first main line 23 and the second main line 33 to the forward port FWD and the reverse port REV may be substantially equalized more precisely. As a result, the bidirectional coupler 3 is obtained in which directivity with respect to the forward signal and directivity with respect to the backward signal are both improved.

Embodiment 4

In Embodiment 4, a variation on a sub line will be described.

Figure 11:
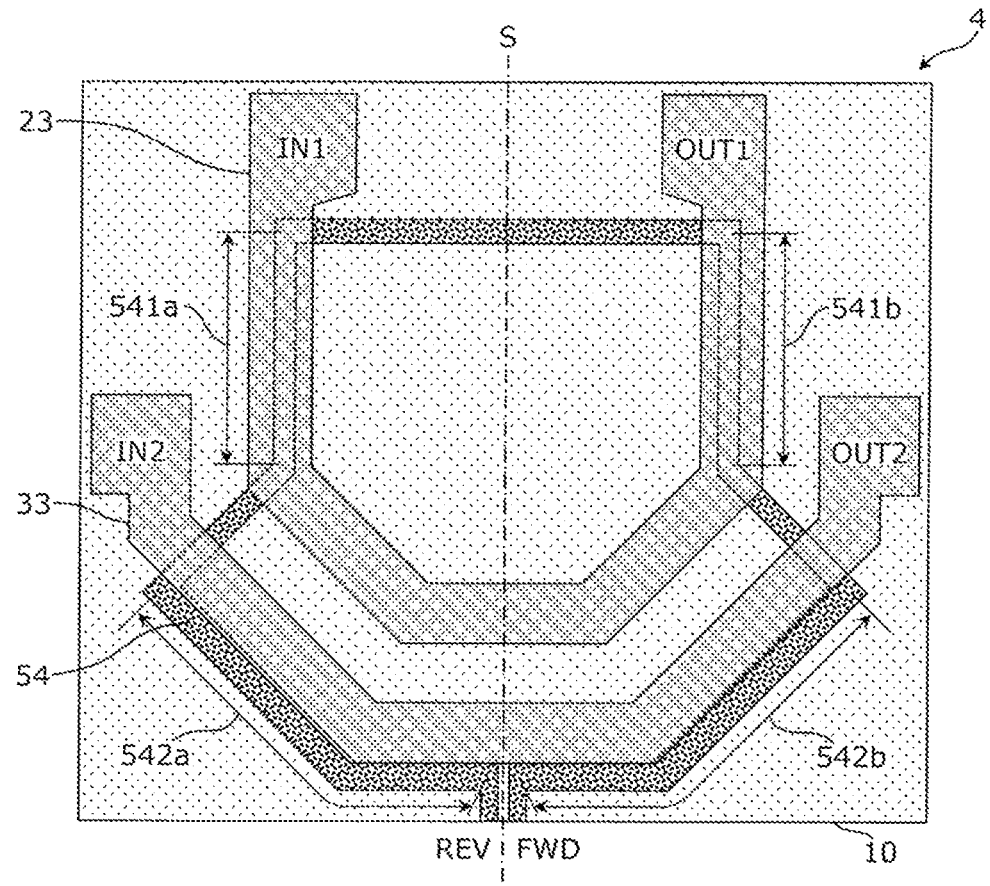
FIG. 11 is a plan view illustrating an example of a configuration of a bidirectional coupler according to Embodiment 4.

FIG. 11 is a plan view illustrating an example of a configuration of a bidirectional coupler according to Embodiment 4. A bidirectional coupler 4 in FIG. 11 is different from the bidirectional coupler 3 of Embodiment 3, in a shape of a sub line 54. Hereinafter, constituent elements that are the same as in Embodiment 3 will be given the same reference numerals, and descriptions thereof will be appropriately omitted.

As illustrated in FIG. 11, in the bidirectional coupler 4, the widths of the sub line 54, that is, dimensions in a direction intersecting a longitudinal direction, of first line portions 541a and 541b, and second line portions 542a and 542b, are different. In an example in FIG. 11, the widths of the second line portions 542a and 542b are larger than the widths of the first line portions 541a and 541b.

As described above, by setting the widths of the sub line 54 for each coupling portion, coupling between the sub line 54 and each of the first main line 23 and the second main line 33 may be optimized in accordance with the widths of the sub line 54. For example, as opposed to the example in FIG. 11, the widths of the first line portions 541a and 541b may be larger than the widths of the second line portions 542a and 542b, depending on optimum conditions for coupling.

Embodiment 5

In Embodiment 5, a variation on a sub line will be described.

Figure 12:
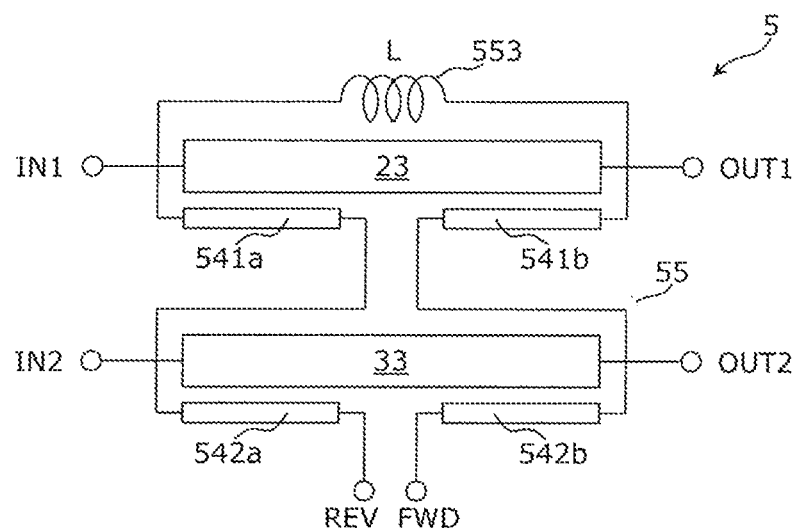
FIG. 12 is a circuit diagram illustrating an example of an equivalent circuit of a bidirectional coupler according to Embodiment 5.

FIG. 12 is a circuit diagram illustrating an example of an equivalent circuit of a bidirectional coupler according to Embodiment 5. A bidirectional coupler 5 in FIG. 12 is different from the bidirectional coupler 3 in FIG. 8, in that an inductor L is inserted into a sub line 55. By inserting the inductor L in series into a midpoint of the sub line 55, directivity of the bidirectional coupler 5 may be improved.

The inductor L may be formed with, for example, a wiring pattern.

Figure 13:
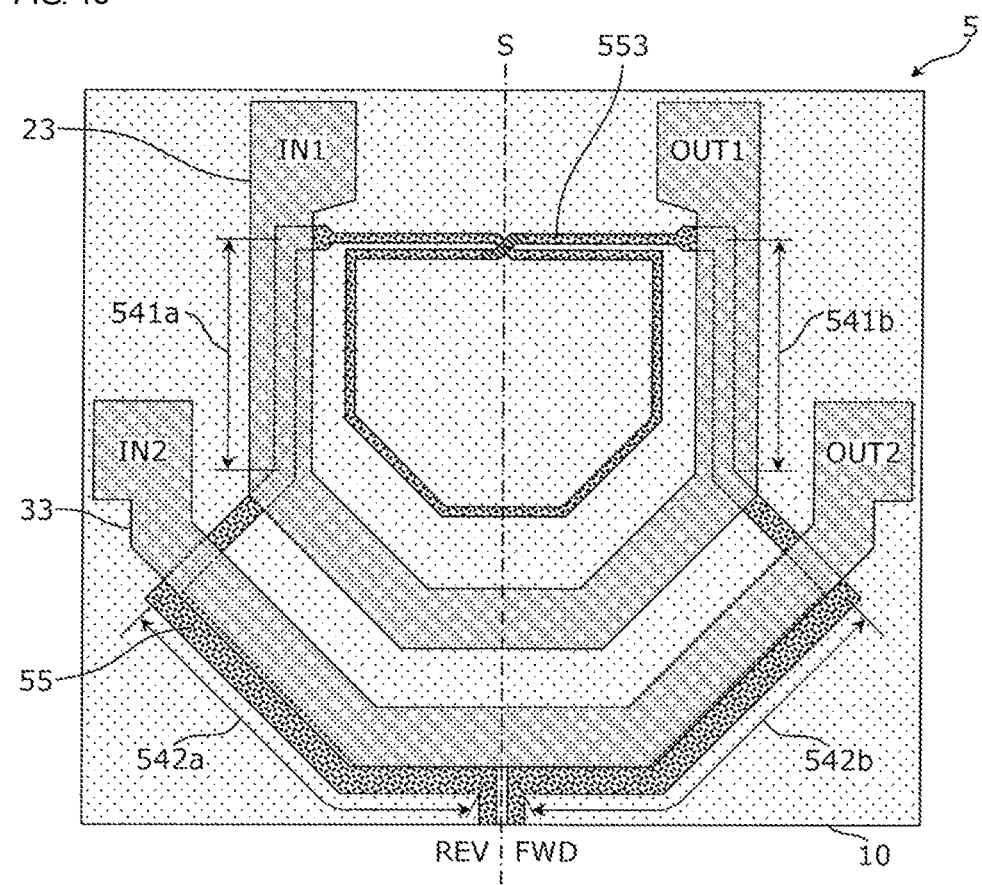
FIG. 13 is a plan view illustrating an example of a configuration of the bidirectional coupler according to Embodiment 5.

FIG. 13 is a plan view illustrating an example of a configuration of the bidirectional coupler 5. As illustrated in FIG. 13, the sub line 55 of the bidirectional coupler 5 is configured by adding a loop-shaped third line portion 553, which interconnects the first line portions 541a and 541b, to the sub line 54 of the bidirectional coupler 4 in FIG. 11.

Since the third line portion 553 functions as the inductor L, directivity of the bidirectional coupler 5 may be improved.

Embodiment 6

In Embodiment 6, a monitor circuit using a bidirectional coupler will be described.

Figure 14:
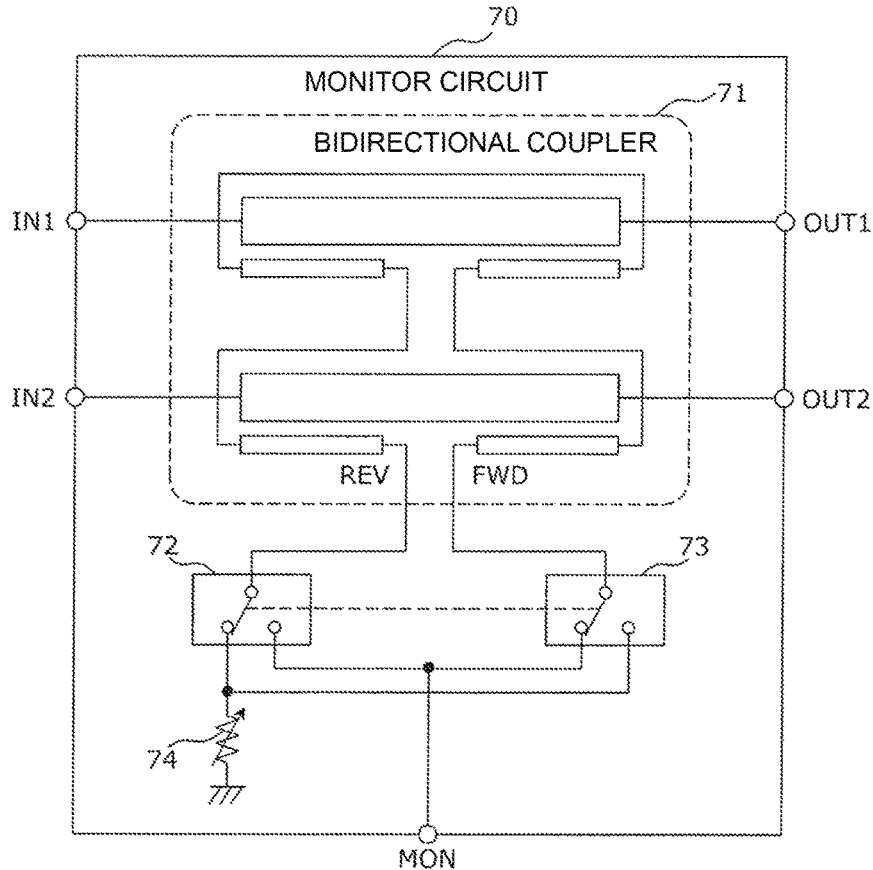
FIG. 14 is a circuit diagram illustrating an example of a monitor circuit using a directional coupler according to Embodiment 6.

FIG. 14 is a circuit diagram illustrating an example of a monitor circuit according to Embodiment 6. A monitor circuit 70 in FIG. 14 includes, a bidirectional coupler 71, switches 72 and 73, and a terminator 74.

One of the bidirectional couplers 1 to 5 described in Embodiments 1 to 5 is used for the bidirectional coupler 71.

The switches 72 and 73 are a pair of single-pole double-throw switches, and interlock in accordance with a control signal (not illustrated).

The terminator 74 is a variable complex impedance that is variable in accordance with a control signal (not illustrated), and, for example, includes a variable resistor and a variable inductor.

According to the monitor circuit 70 configured as described above, it is possible to select a desirable signal from a monitor signal extracted from a forward port FWD and a monitor signal extracted from a reverse port REV with the switch 72 or 73, perform termination appropriately with the terminator 74, and output the signal as a monitor signal MON.

Embodiment 7

In Embodiment 7, a communication device using the monitor circuit according to Embodiment 6 will be described using an example of a dual-band-support communication device capable of performing transmission and reception operations using two different frequency bands.

Figure 15:
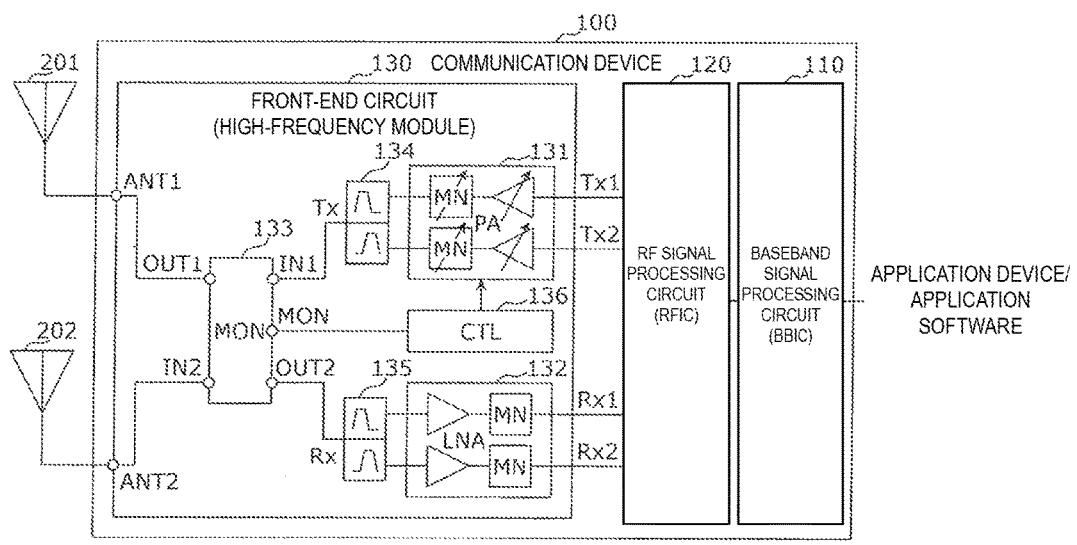
FIG. 15 is a block diagram illustrating an example of a functional configuration of a communication device according to Embodiment 7.

FIG. 15 is a block diagram illustrating an example of a functional configuration of a communication device 100 according to Embodiment 7. As illustrated in FIG. 15, the communication device 100 includes a baseband signal processing circuit 110, an RF signal processing circuit 120, and a front-end circuit 130. The communication device 100 performs transmission and reception operations with multiple bands using antennas 201 and 202.

The baseband signal processing circuit 110 converts transmission data, generated by an application device/application software configured to perform voice communication, image display, or the like, into a transmission signal and supplies the signal to the RF signal processing circuit 120. This conversion may include data compression, multiplexing, adding error correction code, and so on. The baseband signal processing circuit 110 converts a reception signal received from the RF signal processing circuit 120 into reception data, and supplies the data to the application device/application software. This conversion may include data decompression, demultiplexing, and error correction. The baseband signal processing circuit 110 may be configured with a baseband integrated circuit (BBIC) chip.

The RF signal processing circuit 120 converts the transmission signal generated by the baseband signal processing circuit 110 into transmission RF signals Tx1 and Tx2 for respective frequency bands, and supplies the transmission RF signals to the front-end circuit 130. This conversion may include signal modulation and upconversion. The RF signal processing circuit 120 converts reception RF signals Rx1 and Rx2 for the respective frequency bands received from the front-end circuit 130 into a reception signal and supplies the reception signal to the baseband signal processing circuit 110. The RF signal processing circuit 120 may be configured with a radio frequency integrated circuit (RFIC) chip.

The front-end circuit 130 includes, a power amplifier circuit 131, a low-noise amplifier circuit 132, a monitor circuit 133, duplexers 134 and 135, and a controller 136. The duplexers 134 and 135 are configured with filters for the respective frequency bands. The monitor circuit 133 is connected to the duplexers 134 and 135, and antenna terminals ANT1 and ANT2.

The power amplifier circuit 131 amplifies the transmission RF signals Tx1 and Tx2 for the respective frequency bands generated by the RF signal processing circuit 120, matches and supplies the signals to the duplexer 134. Amplification gain and matching impedance in the power amplifier circuit 131 are variable, and are adjusted in accordance with control by the controller 136.

The duplexer 134 combines the transmission RF signals Tx1 and Tx2 for the respective frequency bands received from the power amplifier circuit 131 into a transmission antenna signal Tx, and supplies the signal to the input port IN1 of the monitor circuit 133.

The monitor circuit 133 propagates the transmission antenna signal Tx from the output port OUT1 through the antenna terminal ANT1 to the antenna 201, and outputs a monitor signal MON indicating an intensity of the transmission antenna signal Tx and an intensity of a reflected wave of the transmission antenna signal Tx from the antenna 201.

The monitor circuit 133 receives by the input port IN2 the reception antenna signal Rx from the antenna 202 through the antenna terminal ANT2, and propagates the signal from the output port OUT2 to the duplexer 135.

The monitor circuit 70 of Embodiment 6 is used for the monitor circuit 133.

The duplexer 135 separates the reception RF signals Rx1 and Rx2 for the respective frequency bands from the reception antenna signal Rx, and supplies the signals to the low-noise amplifier circuit 132.

The low-noise amplifier circuit 132 amplifies the reception RF signals Rx1 and Rx2 for the respective frequency bands received from the duplexer 135, matches and supplies the signals to the RF signal processing circuit 120.

The controller 136 controls the amplification gain and the matching impedance of the power amplifier circuit 131 based on the monitor signal MON received from the monitor circuit 133, thereby performing feedback control of a transmission power and matching adjustment with the antenna 201.

The front-end circuit 130 may be configured with a high-frequency module in which the power amplifier circuit 131, the low-noise amplifier circuit 132, the monitor circuit 133, the duplexers 134 and 135, and the controller 136 are mounted. Note that, the controller 136 may be included not in the front-end circuit 130, but in the RF signal processing circuit 120.

In the communication device 100, since a bidirectional coupler in which directivity with respect to a forward signal (transmission signal) and directivity with respect to a backward signal (reflected wave) are both good is used for the monitor circuit 133, it is possible to configure a high-performance communication device that performs various types of control including feedback control of a transmission power and matching adjustment with an antenna with high precision.

The bidirectional coupler, the monitor circuit, and the front-end circuit according to the embodiments of the present disclosure have been described thus far, but the present disclosure is not intended to be limited to the individual embodiments. Variations on these embodiments conceived of by those skilled in the art, embodiments created by combining constituent elements from different embodiments, and so on may be included in the scope of one or more aspects of the present disclosure as long as they do not depart from the essential spirit of the present disclosure.

INDUSTRIAL APPLICABILITY

The present disclosure may be widely used for a bidirectional coupler and a communication device using the bidirectional coupler.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:
1. A bidirectional coupler comprising:
a multilayer substrate; and
a first main line, a second main line, and a sub line,
wherein the first main line, the second main line, and the sub line are provided in or on the multilayer substrate,
wherein the sub line includes a first line portion being a portion electromagnetically coupled with the first main line and an even number of second line portions being portions electromagnetically coupled with the second main line, one half of the even number of second line portions are provided between the first line portion and one end portion of the sub line, and another half of the even number of second line portions are provided between the first line portion and another end portion of the sub line.

2. The bidirectional coupler according to claim 1, wherein the first line portion includes a pair of first line portions.

3. The bidirectional coupler according to claim 2, wherein an electrical length between a midpoint in terms of electrical length of the sub line and one of the pair of first line portions and an electrical length between the midpoint and another one of the pair of first line portions are substantially equal.

4. The bidirectional coupler according to claim 1, wherein the even number of second line portions are a pair of second line portions, and an electrical length between a midpoint in terms of electrical length of the sub line and one of the pair of second line portions and an electrical length between the midpoint and another one of the pair of second line portions are substantially equal.

5. The bidirectional coupler according to claim 1, wherein the even number of second line portions are a pair of second line portions, and in a first area and a second area on both sides of a straight line on the multilayer substrate, the sub line is provided to be symmetrical with the straight line being a symmetry axis, and one and another one of the pair of second line portions are arranged at corresponding positions of the sub line provided to be symmetrical.

6. The bidirectional coupler according to claim 2, wherein in a first area and a second area on both sides of a straight line on the multilayer substrate, the sub line is provided to be symmetrical with the straight line being a symmetry axis, and one and another one of the pair of first line portions are arranged at corresponding positions of the sub line provided to be symmetrical.

7. The bidirectional coupler according to claim 2, wherein one and another one of the pair of first line portions are interconnected with an inductor.

8. The bidirectional coupler according to claim 1, wherein a width in the first line portion and a width in each of the even number of second line portions, of the sub line, are different from each other.

9. A monitor circuit comprising:
the bidirectional coupler according to claim 1.

10. A front-end circuit comprising:
the monitor circuit according to claim 9,
an antenna terminal connected to the monitor circuit, and a filter connected to the monitor circuit.

11. The bidirectional coupler according to claim 2, wherein the even number of second line portions are a pair of second line portions, and an electrical length between a midpoint in terms of electrical length of the sub line and one of the pair of second line portions and an electrical length between the midpoint and another one of the pair of second line portions are substantially equal.

12. The bidirectional coupler according to claim 3, wherein the even number of second line portions are a pair of second line portions, and an electrical length between a midpoint in terms of electrical length of the sub line and one of the pair of second line portions and an electrical length between the midpoint and another one of the pair of second line portions are substantially equal.

13. The bidirectional coupler according to claim 2, wherein the even number of second line portions are a pair of second line portions, and in a first area and a second area on both sides of a straight line on the multilayer substrate, the sub line is provided to be symmetrical with the straight line being a symmetry axis, and one and another one of the pair of second line portions are arranged at corresponding positions of the sub line provided to be symmetrical.

14. The bidirectional coupler according to claim 3, wherein the even number of second line portions are a pair of second line portions, and in a first area and a second area on both sides of a straight line on the multilayer substrate, the sub line is provided to be symmetrical with the straight line being a symmetry axis, and one and another one of the pair of second line portions are arranged at corresponding positions of the sub line provided to be symmetrical.

15. The bidirectional coupler according to claim 4, wherein the even number of second line portions are a pair of second line portions, and in a first area and a second area on both sides of a straight line on the multilayer substrate, the sub line is provided to be symmetrical with the straight line being a symmetry axis, and one and another one of the pair of second line portions are arranged at corresponding positions of the sub line provided to be symmetrical.

16. The bidirectional coupler according to claim 3, wherein in a first area and a second area on both sides of a straight line on the multilayer substrate, the sub line is provided to be symmetrical with the straight line being a symmetry axis, and one and another one of the pair of first line portions are arranged at corresponding positions of the sub line provided to be symmetrical.

17. The bidirectional coupler according to claim 3, wherein one and another one of the pair of first line portions are interconnected with an inductor.

18. The bidirectional coupler according to claim 2, wherein a width in the first line portion and a width in each of the even number of second line portions, of the sub line, are different from each other.

19. The bidirectional coupler according to claim 3, wherein a width in the first line portion and a width in each of the even number of second line portions, of the sub line, are different from each other.

20. The bidirectional coupler according to claim 4, wherein a width in the first line portion and a width in each of the even number of second line portions, of the sub line, are different from each other.

* * * * *